(12) United States Patent
Ghannam (10) Patent No.: US 11,133,264 B2
(45) Date of Patent: Sep. 28, 2021

(54) ELECTRONIC SYSTEM COMPRISING A LOWER REDISTRIBUTION LAYER AND METHOD FOR MANUFACTURING SUCH AN ELECTRONIC SYSTEM

(71) Applicant: 3DIS TECHNOLOGIES, Labege (FR)

(72) Inventor: Ayad Ghannam, Toulouse (FR)

(73) Assignee: 3DIS TECHNOLOGIES, Labege (FR)

( * ) Notice: Subject to any disclaimer, the term of this patent is extended or adjusted under 35 U.S.C. 154(b) by 27 days.

(21) Appl. No.: 16/637,717

(22) PCT Filed: Aug. 8, 2018

(86) PCT No.: PCT/EP2018/071516
§ 371 (c)(1),
(2) Date: Feb. 7, 2020

(87) PCT Pub. No.: WO2019/030288
PCT Pub. Date: Feb. 14, 2019

(65) Prior Publication Data
US 2020/0185331 A1 Jun. 11, 2020

(30) Foreign Application Priority Data

Aug. 8, 2017 (FR) ...................................... 1757588

(51) Int. Cl.
*H01L 23/538* (2006.01)
*H01L 21/48* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC ............. H01L 23/5389; H01L 23/5383; H01L 23/5386; H01L 21/4857; H01L 21/568;
(Continued)

(56) References Cited

U.S. PATENT DOCUMENTS

| | | |
|---|---|---|
| 2005/0200006 A1 | 9/2005 | Pu et al. |
| 2016/0056057 A1 | 2/2016 | Yu et al. |

(Continued)

FOREIGN PATENT DOCUMENTS

| | | |
|---|---|---|
| DE | 10 2008 022733 A1 | 11/2009 |
| DE | 10 2015 104507 A1 | 6/2016 |

(Continued)

OTHER PUBLICATIONS

Search Report from French Intellectual Property Office on corresponding FR application (FR1757588) dated Apr. 11, 2018.
(Continued)

*Primary Examiner* — Marcos D. Pizarro
*Assistant Examiner* — Antonio B Crite
(74) *Attorney, Agent, or Firm* — Klein, O'Neill & Singh, LLP (57) ABSTRACT

The invention relates to a method for producing an electronic system, comprising: a step of forming a plurality of interconnect paths obtained via metal deposition on the sacrificial member to form a lower redistribution layer defining a plurality of lower connection ports connected to a plurality of inner connection ports; a step of depositing at least one electronic component on the lower redistribution layer; and a step of forming a plurality of three-dimensional interconnect paths obtained via metal deposition in order to connect the connectors of the electronic component to the inner connection ports of the lower redistribution layer.

15 Claims, 4 Drawing Sheets

(51) Int. Cl.
| | |
|---|---|
| *H01L 21/56* | (2006.01) |
| *H01L 21/683* | (2006.01) |
| *H01L 23/31* | (2006.01) |
| *H01L 23/00* | (2006.01) |
| *H01L 23/498* | (2006.01) |
| *H01L 25/00* | (2006.01) |
| *H01L 25/18* | (2006.01) |
| *H01L 25/065* | (2006.01) |

(52) U.S. Cl.
CPC .......... *H01L 21/565* (2013.01); *H01L 21/568* (2013.01); *H01L 21/6835* (2013.01); *H01L 23/3128* (2013.01); *H01L 23/5383* (2013.01); *H01L 23/5386* (2013.01); *H01L 24/19* (2013.01); *H01L 24/20* (2013.01); *H01L 2221/68372* (2013.01); *H01L 2224/214* (2013.01)

(58) Field of Classification Search
CPC ... H01L 21/6835; H01L 21/561; H01L 21/78; H01L 21/76838; H01L 21/76895; H01L 24/19; H01L 24/20; H01L 24/82; H01L 24/24; H01L 24/18
See application file for complete search history.

(56) References Cited

U.S. PATENT DOCUMENTS

2017/0098628 A1* 4/2017 Liu .................. H01L 21/568
2018/0166396 A1* 6/2018 Lee .................. H01L 21/565

FOREIGN PATENT DOCUMENTS

| EP | 3128548 A1 | 2/2017 |
|---|---|---|
| JP | H01 140652 A | 6/1989 |

OTHER PUBLICATIONS

International Search Report and Written Opinion on corresponding PCT application (PCT/EP2018/071516) from International Searching Authority (EPO) dated Jan. 18, 2019.

* cited by examiner

ELECTRONIC SYSTEM COMPRISING A LOWER REDISTRIBUTION LAYER AND METHOD FOR MANUFACTURING SUCH AN ELECTRONIC SYSTEM

TECHNICAL FIELD

The present invention relates to an electronic system suited to be fixed to a printed circuit board, the printed circuit board next being able to be mounted in an electronic device, for example, a smartphone.

BACKGROUND

In a known manner, an electronic system may comprise several electronic chips which are mounted in a package to form an interface between the electronic chips and the printed circuit, known to those skilled in the art under the designation "Printed Circuit Board" (PCB). For this purpose, the package comprises connection ports.

In order to be able to improve the performances of such an electronic system, it is necessary to decrease or to eliminate the parasitic elements generated by the connections that connect the different electronic chips to the package. For this purpose, it is desirable to reduce the electrical lengths of these connections by reducing the distance between the chips and by miniaturising the packaging. Also, it has been proposed to stack the electronic chips vertically in a same packaging in order to further decrease losses.

However, this miniaturisation is difficult to attain on account of the limitations of current assembly techniques. Indeed, most assembly techniques necessitate manufacturing a package, placing the electronic chips in the package, connecting said electronic chips to the package using wire-bonds and encapsulating the assembly to protect it from its environment. The use of wire-bonds leads to considerable losses, which is a drawback.

When it is wished to obtain a system comprising a large number of connection ports, it is desirable to provide a redistribution layer which makes it possible to form an interface between the connection ports of the system and the connectors of the electronic components. In particular, when the electronic chip comprises dense connectors, that is to say very close to each other, a redistribution layer makes it possible to move apart the connection ports of the system in order to cooperate in an optimal manner with an integrated circuit.

For this purpose, a system is known from the patent application US2016/0064342 comprising an electronic chip, comprising connectors, which is positioned on a lower carrier with the connectors placed upwards. The lower carrier comprises metal connection ports. A metal redistribution layer is placed on the connectors of the electronic chip in order to form a system. Through vias make it possible to connect the redistribution layer with the connection ports in order to allow the system to form an interposer between a printed circuit and an auxiliary system. Such a system necessitates very numerous production steps (creation of vias, etc.), which increases the cost thereof. Moreover, the redistribution layer has an important thickness and necessitates numerous preparation steps before being able to be connected to the electronic chip, which has drawbacks.

Furthermore, the components and the electronic systems need to evacuate the heat that they generate. The package plays a very important role in the dissipation of this heat since it makes it possible to improve or to degrade it. It is observed that packages that use wire-bonds, such as QFN, have excellent thermal dissipation but poor electrical performances. On the other hand, "flip-chip" type packages exhibit better electrical performances but have poor thermal dissipation.

There thus exists a need to form an electronic system forming a package of which the connection ports are connected in an optimal manner to the connectors of the electronic components of the system and which enables excellent thermal dissipation.

A method for manufacturing a functional unit comprising an assembly of several electronic components assembled on a substrate is known from the patent application DE 10 2008 022733 A1. This document teaches connecting the connectors of an electronic component to connection ports using an interconnection in two parts.

SUMMARY

For this purpose, the invention relates to an electronic system comprising a front surface, the electronic system comprising:
- a lower redistribution layer defining a plurality of lower connection ports connected to a plurality of inner connection ports,
- at least one electronic component, each electronic component comprising a front surface comprising a plurality of connectors and a rear surface opposite to the front surface, the rear surface of the electronic component being positioned facing the lower redistribution layer on the side of the inner connection ports,
- a plurality of three-dimensional interconnections forming a redistribution layer connecting the connectors of the electronic component to the inner connection ports of the lower redistribution layer, and
- an encapsulation layer.

Thanks to the invention, the electronic components may be connected in a practical manner and without loss between them. In addition, the connection ports of the system are easily configurable and the system may thus be directly mounted on an integrated circuit. Such a system may advantageously receive electronic components of different natures and connect them together in a practical manner. In addition, the lower redistribution layer makes it possible to offer great flexibility in the arrangement of the connection ports of the system, that is to say, the lower connection ports of the lower layer.

In a preferred manner, the invention relates to an electronic system comprising a front surface, the electronic system comprising:
- a lower redistribution layer defining a plurality of lower connection ports connected to a plurality of inner connection ports forming the connection ports of the system, the lower redistribution layer being formed by a plurality of interconnections produced by metal deposition,
- at least one electronic component, each electronic component comprising a front surface comprising a plurality of connectors and a rear surface opposite to the front surface, the rear surface of the electronic component being positioned facing the lower redistribution layer on the side of the inner connection ports,
- a plurality of three-dimensional interconnections, produced during a same step, forming a redistribution layer connecting the connectors (30) of the electronic component (3) to the inner connection ports of the lower redistribution layer, the plurality of interconnections being produced by metal deposition in openings formed of a photosensitive resin layer, said openings defining the shape of the three-dimensional interconnections, and an encapsulation layer.

In a preferred manner, the three-dimensional interconnections only extend in the bottom of the openings formed in the photosensitive resin layer. In a preferred manner, the ends of the three-dimensional interconnections are situated at different vertical distances.

Preferably, the system comprises a plurality of electronic components assembled vertically to form a stack. Thus, all the connectors of the electronic components are connected to the connection ports in an optimal manner with reduced bulk.

Further preferably, the electronic components have the same orientation in the stack.

According to an aspect of the invention, the electronic component comprises built-up conductive pads transferred onto the connectors of said electronic component. Such built-up pads make it possible to vertically offset the connectors with respect to the front surface of the electronic component. In other words, the conductive pads vertically project from the front surface of the electronic component.

Such built-up pads make it possible to improve the compatibility with the interconnections or to offset the position of the connectors in order to limit the risk of interference between the three-dimensional interconnections and the electronic component. In a preferred manner, the transferred built-up pads are formed prior to the three-dimensional interconnection production step. Advantageously, the built-up pads make it possible to make the three-dimensional interconnections compatible with the connectors of the electronic component by forming a compatible metal interface.

In a preferred manner, the electronic system comprises:
a first stack of electronic components forming a lower sub-system of which the rear surface of an electronic component belongs to the front surface of the lower sub-system,
a second stack of electronic components forming an upper sub-system and
a built-up redistribution layer formed between the lower sub-system and the upper sub-system so as to connect them.

An overall electronic system formed of a plurality of sub-systems which are stacked vertically together is advantageously formed. The built-up redistribution layer makes it possible to link the connection ports of the lower sub-system with those of the upper sub-system.

Preferably, the electronic system comprises a plurality of upper sub-systems, two adjacent upper sub-systems being connected by a built-up redistribution layer. Thus, it is possible to form in an iterative manner a large number of sub-systems to obtain an overall electronic system having numerous functionalities.

For this purpose, the invention relates to a method for manufacturing an electronic system comprising:
a step of applying a sacrificial element on a carrier,
a step of producing a lower redistribution layer defining a plurality of lower connection ports connected to a plurality of inner connection ports,
a step of transferring at least one electronic component onto the lower redistribution layer, each electronic component comprising a front surface comprising a plurality of connectors and a rear surface opposite to the front surface, the rear surface of the electronic component being positioned facing the lower redistribution layer on the side of the inner connection ports,
a step of producing a plurality of three-dimensional interconnections produced by metal deposition so as to connect the connectors of the electronic component to the inner connection ports of the lower redistribution layer,
an encapsulation step, and
a step of separating the system from the sacrificial element.

Thanks to the invention, since the sacrificial element may be removed, the lower connection ports of the system are made accessible in a practical manner. The system may thus be directly mounted on an integrated circuit. Such a system may advantageously receive electronic components of different natures and connect them together in a practical manner. In addition, the lower redistribution layer makes it possible to offer great flexibility in the arrangement of the connection ports of the system, that is to say, the lower connection ports of the lower redistribution layer.

The invention also relates to a method for manufacturing an electronic system comprising:
a step of applying a sacrificial element on a carrier,
a step of producing a lower redistribution layer defining a plurality of lower connection ports connected to a plurality of inner connection ports forming the connection ports of the system, the lower redistribution layer being formed by a plurality of interconnections produced by metal deposition,
a step of transferring at least one electronic component onto the lower redistribution layer, each electronic component comprising a front surface comprising a plurality of connectors and a rear surface opposite to the front surface, the rear surface of the electronic component being positioned facing the lower redistribution layer on the side of the inner connection ports,
a step of producing a plurality of three-dimensional interconnections produced by metal deposition so as to connect the connectors of the electronic component to the inner connection ports of the lower redistribution layer, the plurality of interconnections being produced by metal deposition in openings formed of a photosensitive resin layer, said openings defining the shape of the three-dimensional interconnections,
an encapsulation step, and
a step of separating the system from the sacrificial element.

In other words, according to the invention, the interconnections connecting the connectors of the electronic component to the inner connection ports of the lower redistribution layer are produced in one go, during a same step.

In a preferred manner, the three-dimensional interconnections only extend in the bottom of the openings formed in the photosensitive resin layer. In a preferred manner, the ends of the three-dimensional interconnections are situated at different distances.

Preferably, the method comprises a plurality of steps of transferring electronic components and a plurality of steps of producing three-dimensional redistribution layers. This advantageously makes it possible to form a stack of electronic components connected together and to the inner connection ports of the lower redistribution layer. Thanks to this plurality of steps, electronic components of same size or of different size may thus be integrated in a same system in order to increase the density in an optimal manner.

Preferably, the lower redistribution layer is planar.

According to a preferred aspect, the method comprises a step of depositing a passivation layer so as to cover the surface of the lower redistribution layer and the electronic component while maintaining the plurality of inner connection ports uncovered.

According to a preferred aspect, the method comprises a plurality of steps of producing lower redistribution layers and passivation layers so as to produce a stack of metal connections. Such a stack makes it possible to rout a high density of electrical connections and to arrange easily the lower connection ports of the system.

In a preferred manner, the sacrificial element is in the form of an adhesive film, in particular, double-sided. Such a sacrificial element is simple to handle for an operator. Moreover, a double-sided adhesive film enables the support and the electronic components to be made integral with each other in a temporary manner during the production of the system.

According to an aspect of the invention, the sacrificial element is in the form of a layer of adhesive resin.

According to another aspect of the invention, the sacrificial element is in the form of a layer made of non-adhesive polymer.

Further preferably, the sacrificial element is configured to lose its adherence characteristics from a predetermined temperature. Such a sacrificial element may be removed in a practical manner without mechanical action being able to damage the system produced. In a preferred manner, the sacrificial element loses its adherence characteristics from a temperature below 250° C., which avoids damaging the system during heating.

In another preferred manner, the sacrificial element is configured to lose its adherence characteristics following an illumination, in particular, by a UV light source such as a laser and/or a mercury lamp. During such an illumination, the sacrificial element converts the light into thermal energy or generates a gas, which cancels the adherence characteristics. For this purpose, a sacrificial element of the "BrewerBond"® from Brewer Science, "WSS"® from 3M or "SELFA" from Sekisui type is particularly suited.

According to a preferred aspect, the sacrificial element is selected from the following set: "ZoneBond"®, "BrewerBond"® and "WaferBond"® from Brewer Science, "WSS"® from 3M, "SELFA"® from Sekisui and "Revalpha"® from Nitto. Such sacrificial elements have optimal characteristics at reduced cost. It goes without saying that other trade names of other companies could also be suitable.

Further preferably, the sacrificial element enables a lift-off of the electronic system by mechanical action without deterioration. For this purpose, a sacrificial element of the "TM-X12"® from Hitachi Chemicals type is particularly suited.

In a preferred manner, lower connection ports extend under the electronic component. In other words, the lower connection ports are positioned in a practical manner and independent of the electronic component.

In a preferred manner, the method comprises a step of producing an upper redistribution layer connected to connectors of said electronic component. Thus, the upper surface and the lower surface of the component enable an analogous redistribution on each side of the electronic component, which facilitates the production of a system with high integration density.

Preferably, the method comprises a step of depositing at least one electronic component on the upper redistribution layer, each electronic component comprising a front surface comprising a plurality of connectors and a rear surface opposite to the front surface, the rear surface of the electronic component being positioned facing the upper redistribution layer. Stacks of components may thus be mounted in tiers thanks to the presence of the upper redistribution layer which makes it possible to offer connection ports easily accessible to connect two different stacks with three-dimensional interconnections. It is thus possible to form very complex and very dense systems.

Preferably, the method comprises a step of producing an opening in the system so as to uncover the front face of at least one electronic component having a sensor function. Thus, the method is compatible for the production of a system having a sensor function.

Preferably, the method comprises a step of putting in place conductive balls on the lower connection ports of the lower redistribution layer.

In a preferred manner, the method comprises at least two steps of depositing a passivation layer in order to protect the interconnections in the system.

Advantageously, the method comprises at least two steps of producing a plurality of three-dimensional interconnections in order to form several superimposed redistribution layers. Complex redistributions may then be produced in a practical manner.

According to a preferred aspect, the method comprises a step of producing a passivation layer prior to the lower redistribution layer. This passivation layer comprises openings for the production of lower connection ports accessible for the soldering. It is thus possible to protect the lower redistribution layer and to improve the robustness and the reliability of the electronic system.

Preferably, the method comprises a step of forming a three-dimensional passive component during the step of producing a plurality of three-dimensional interconnections. Such a three-dimensional passive element is preferably produced in a single step, which accelerates the production of the system.

According to a preferred aspect, the method comprises a step of depositing a metal layer on the rear surface of at least one electronic component so as to improve the thermal dissipation.

In a preferred manner, the method comprises a step of transferring at least two superimposed electronic components onto the lower redistribution layer and a step of connecting connectors of said electronic components during the step of producing a plurality of three-dimensional interconnections. Complex assemblies may advantageously be produced in a system.

Thanks to the invention, an electronic system comprising heterogeneous electronic components is produced in a practical and inexpensive manner based on three-dimensional interconnections. The vertical dimension is advantageously taken advantage of to increase the integration density. In addition, the lower redistribution layer makes it possible to facilitate the arrangement of the connection ports.

Preferably, at least one connector and at least one inner connection port of the lower redistribution layer are spaced apart by a vertical distance greater than 10 µm, preferably greater than 40 µm, and three-dimensionally interconnected. The vertical direction is defined orthogonally to the horizontal direction along which the sacrificial element extends. Such a spacing apart imposes important technical constraints for the interconnection.

In a preferred manner, at least one interconnection, connecting at least one connector and at least one inner connection port, has an aspect ratio greater than 2.5:1, preferably greater than 5:1, further preferably greater than 10:1 for a vertical distance comprised between 10 µm and 100 µm. Beyond a vertical distance of 100 µm, this aspect ratio is greater than 1.5:1, preferably greater than 3:1, further preferably greater than 6:1. As a reminder, the aspect ratio corresponds to the vertical distance traversed by the interconnection over its width.

Preferably, the method comprises a step of depositing a passivation layer so as to cover the surface of the lower redistribution layer and the electronic component while maintaining the plurality of connectors of the electronic component and inner connection ports uncovered.

Preferably, the passivation layer is deposited conformally, that is to say with a variation in its thickness on the horizontal and/or vertical wall and/or overcut and/or undercut less than 50%, preferably less than 25%. This advantageously makes it possible to increase the compactness of the system.

BRIEF DESCRIPTION OF THE DRAWINGS

The invention will be better understood on reading the description that follows, given uniquely as an example, and by referring to the appended drawings in which.

The figures may obviously serve to better define the invention if need be.

DETAILED DESCRIPTION

An electronic system will now be described comprising a plurality of electronic components capable of being mounted on a printed circuit in order to form an electronic board. Such an electronic board may be mounted in any sort of electronic device, for example, a computer, a watch, a smartphone, a connected object, an item of clothing, a portable item of equipment, etc.

A "system in package" type system is advantageously formed, which comprises several electronic components. In the example that follows, the production of a system comprising conductive balls will be described but it goes without saying that it is also possible to produce a system of the QFN or LGA type of which the connection ports extend in a same plane in the continuity of said system, that is to say, without projecting.

An example of manufacture of a system according to the invention will be described with reference to FIG. 1 illustrating several technical manufacturing steps.

Figure 1A:
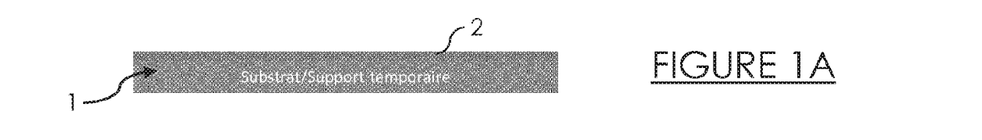
FIGS. 1A-1I are schematic representations of steps of producing a system according to the invention.

Firstly, with reference to FIG. 1A, a step of applying a sacrificial element 2 on a carrier 1 is represented.

In a preferred manner, the carrier 1 is in the form of a flat surface based on silicon, glass, ceramic, metal, organic materials or any type of material capable of serving as support. The carrier 1 is preferably circular or rectangular but it goes without saying that other shapes could be suitable. Preferably, the surface area of the support is greater than 2000 mm$^2$.

The sacrificial element 2 has a double function. It makes it possible, on the one hand, to position in a precise and robust manner the lower redistribution layer 7 of the system during its production and, on the other hand, to be able to release it when the system is produced. In other words, the sacrificial element 2 forms a temporary support for the lower redistribution layer 7 in order that it is integrated in the system S.

Further preferably, the sacrificial element 2 is in the form of a layer which is organic, inorganic, polymeric or metallic. The sacrificial element 2 may be deposited by spin coating, by spray, by lamination, by stamping, by growth or analogous. As an example, a sacrificial element 2 of the "ZoneBond"®, "WaferBond"® and "BrewerBond"® from Brewer Science, "WSS"® from 3M, "SELFA"® from Sekisui and "Revalpha"® from Nitto type. In a preferred manner, the sacrificial element 2 is in the form of an adhesive film which is simple to handle, in particular, double-sided. Preferably, the sacrificial element 2 is configured to lose its adherence characteristics from a predetermined temperature. For this purpose, a sacrificial element 2 of the "Revalpha"® from Nitto type is particularly suited. In another preferred manner, the sacrificial element 2 is configured to lose its adherence characteristics following an illumination, in particular, by a UV light source such as a laser and/or a mercury lamp. During such an illumination, the sacrificial element 2 converts the light into thermal energy or generates a gas, which cancels the adherence characteristics. For this purpose, a sacrificial element 2 of the "BrewerBond"® from Brewer Science or "WSS"® from 3M or "SELFA"® from Sekisui type is particularly suited. Further preferably, the sacrificial element 2 enables a lift-off of the system by mechanical action without deterioration. For this purpose, a sacrificial element 2 of the "TM-X12"® from Hitachi Chemicals type is particularly suited.

Figure 1B:
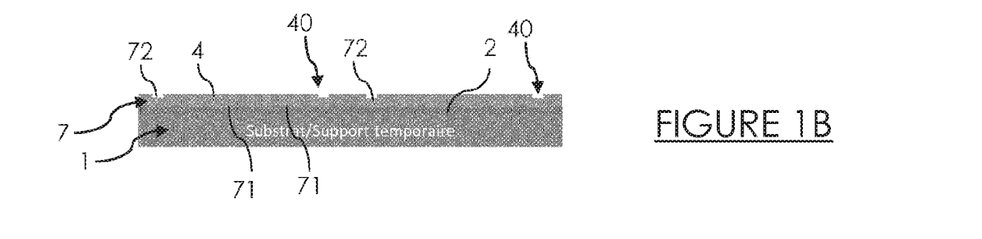

With reference to FIG. 1B, a step is represented of producing a plurality of interconnections produced by metal deposition on the sacrificial element 2 in order to form a lower redistribution layer 7 defining a plurality of lower connection ports 71 connected to a plurality of inner connection ports 72. Such a redistribution layer 7 makes it possible to connect the connection ports 71, 72 which are spaced apart from each other in order to improve the integration.

The lower redistribution layer 7 comprises lower connection ports 71 in contact with the sacrificial element 2 and inner connection ports 72, in the upper part, intended to connect with the electronic components 3. The lower connection ports 71 form the connection ports of the system S.

With reference to FIG. 1B, a step is represented of depositing a first passivation layer 4 so as to cover the lower redistribution layer 7 while forming openings 40 maintaining a plurality of inner connection ports 72 of the lower redistribution layer 7 uncovered.

The first passivation layer 4 may be composed of an organic or inorganic material, such as a semiconductor oxide, a metal oxide, a polymer or any other electrically insulating material. It may be deposited by spin coating, by spray, by lamination, by stamping, by growth, by printing (inkjet), by vacuum deposition or by any type of deposition known to those skilled in the art. Preferably, the openings 40 are produced by means of a photolithography method or by means of a wet and/or dry chemical etching, by plasma or by laser. In a preferred manner, photosensitive materials are favoured given the advantages offered by photolithography methods.

The deposition of the first passivation layer 4 is optional, the electronic components 3 being able to be deposited directly on the lower redistribution layer 7.

Figure 1C:
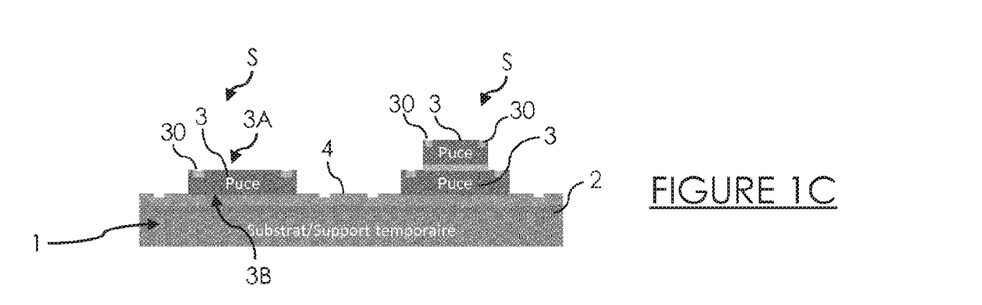
Figure 2:
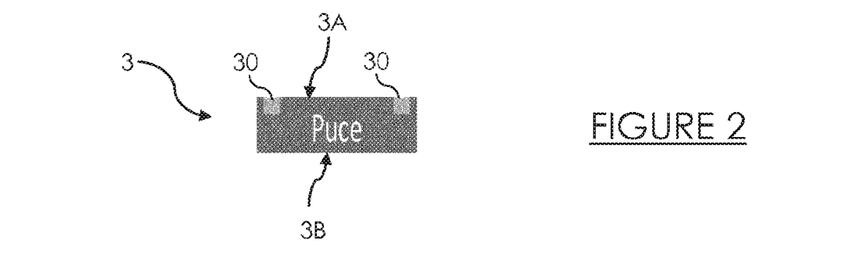
FIG. 2 is a schematic representation of an electronic component.

With reference to FIG. 1C, the method comprises a step of transferring at least one electronic component 3 onto the first passivation layer 4. As illustrated in FIG. 2, each electronic component 3 comprises a front surface 3A comprising a plurality of connectors 30 and a rear surface 3B opposite to the front surface 3A. Preferably, the rear surface 3B of each electronic component 3 is devoid of connectors 30. The rear surface 3B of the electronic component 3 is positioned in contact with the first passivation layer 4, facing the lower redistribution layer 7. The electronic components 3 are positioned outside of the openings 40 of the first passivation layer 4 as illustrated in FIG. 1C.

In this example, as illustrated in FIG. 1C, two electronic components 3 are positioned directly in contact with the first passivation layer 4 and are designated level 1 electronic components. Other electronic components may be positioned in superposition on the level 1 electronic components 3, these electronic components 3 being designated level 2 electronic components. When an electronic component 3 is superimposed on an electronic component of given level n, the superimposed electronic component 3 has a level n+1. With reference to the right part of FIG. 1C, a level 2 electronic component is positioned on one of the level 1 electronic components. The rear surface 3B of the level 1 electronic components 3 is positioned on the first passivation layer 4.

The positioning of the electronic components 3 is preferably achieved by a so-called "pick and place" transfer method. Furthermore, an adhesive layer is applied between two superimposed electronic components 3. The adhesive layer is deposited between the rear surface 3B of the upper level electronic component 3 and the front surface 3A of the lower level electronic component 3. The precise positioning makes it possible to guarantee an optimal interconnection.

In a preferred manner, the total vertical thickness (electronic component(s) 3 and adhesive layer(s)) is greater than 10 μm, more particularly, greater than 40 μm. The sides of the electronic components 3 may be straight, overcut and/or undercut. For the sake of clarity, only electronic components 3 having straight sides have been used in the figures.

With reference to the right part of FIG. 1C, the electronic system S comprises several electronic components 3 assembled vertically to form a stack. The electronic components 3 have the same orientation in the stack. The rear surface 3B of the upper level electronic component 3 is mounted on the front surface 3A of the lower level electronic component 3. It goes without saying that the electronic system S could comprise a stack of a large number of electronic components 3 of different natures.

In a preferred manner, each upper level electronic component 3 of a stack has dimensions smaller than the lower level electronic component 3 so as to form a stack facilitating the formation of three-dimensional interconnections between the different electronic components 3. The compactness and integration density are thus increased in a practical manner.

In a preferred manner, the stack is pyramidal or staircase-shaped. According to the latter case, it is possible to stack electronic components 3 having an identical size or instead electronic components 3 of larger size above electronic components 3 of smaller size. It goes without saying that the electronic components 3 may have different dimensions.

In the absence of passivation layer 4, the electronic components 3 are transferred directly onto the lower redistribution layer 7.

Figure 1D:
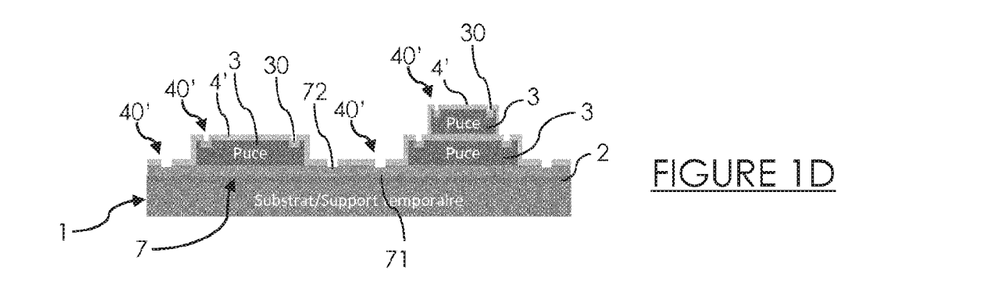

With reference to FIG. 1D, a step is represented of depositing a second passivation layer 4' so as to cover the surface of the first passivation layer 4 and the front surface 3A of the electronic component 3 while forming openings 40' maintaining the plurality of inner connection ports 72 of the redistribution layer 7 and the connectors 30 of the electronic components 3 uncovered.

According to the need of the system, the second passivation layer 4' is deposited conformally or so as to adapt the angle of the sides of the electronic components 3. The second passivation layer 4' may be composed of an organic or inorganic material, such as a semiconductor oxide, a metal oxide, a polymer or any other electrically insulating material. It may be deposited by spin coating, by spray, by lamination, by stamping, by growth, by printing (inkjet), by vacuum deposition or by any type of deposition known to those skilled in the art.

Still with reference to FIG. 1D, the openings 40' are produced in the second passivation layer 4', in order to uncover the connectors 30 of the electronic components 3 and the inner connection ports 72. Preferably, the openings 40' are produced by means of a photolithography method or by means of a wet and/or dry chemical etching, by plasma or by laser. In a preferred manner, photosensitive materials are favoured given the advantages offered by photolithography methods.

According to the need of the system, the passivation layer 4' is deposited uniquely to cover the sides of the electronic components 3 as well as a part of the surface of the electronic component 3, thus forming a sarcophagus around said electronic component 3. In this case, the openings 40 in the passivation layer 4 are directly accessible to the three-dimensional interconnections.

In the case where the surfaces and the sides of the electronic components 3 are insulating except at the level of the connectors 30, the deposition of the second passivation layer 4' may not be applied, thus reducing the manufacturing time and cost.

Figure 1E:
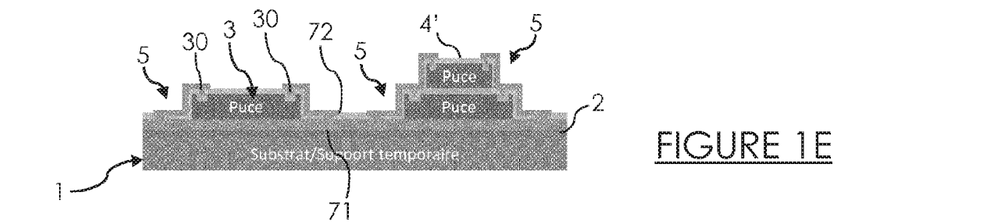

With reference to FIG. 1E, a step is represented of producing a plurality of three-dimensional interconnections 5 produced by metal deposition so as to connect the uncovered zones 40' of the redistribution layer 7 to the connectors 30 of the electronic component 3.

The three-dimensional interconnections are known per se, in particular, by the patent application FR2965659. In this example, to produce the three-dimensional interconnections 5, the method comprises:

a step of depositing a metal layer by evaporation, by spray or other, which fulfils both a function of seed and growth base for the metal constituting the three-dimensional interconnections. This metal layer may be composed of a single or of several electrically conductive materials and/or semiconductors.

- a step of depositing a thick layer of photosensitive resin and a step of producing openings by photolithography techniques, by laser ablation or others, in order to create a mould necessary for the deposition of the metal constituting the three-dimensional interconnections. These openings define the shape of the three-dimensional interconnections 5 as well as those of the metal tracks connecting the connectors 30 of the electronic component 3 to the inner connection ports 72. According to the integration need, the thickness of the photosensitive resin layer can vary from 20 to 700 μm and the aspect ratio (resolution) from 0.5:1 to 50:1.
- a step of depositing a metal layer by electrolysis or any other metal growth technique. The deposited metal may be copper, gold, silver, nickel, an alloy of metals or any other electrically conductive material.
- a step of dissolution of the resin mould and a step of etching of the seed layer. These methods are known to those skilled in the art. However, in the case where the seed layer contains gold, a solution based on KI+I2 and additives could be used to etch this layer without damaging the three-dimensional interconnections.

In this example, the lower connection ports 71 and the connectors 30 of the electronic components 3 are respectively connected together by the redistribution layer formed by the three-dimensional interconnections 5 produced by metal deposition and by the lower redistribution layer 7. Advantageously, even in the case of a plurality of electronic components 3, the three-dimensional interconnections 5 are produced during a single and same step, which procures an important time saving. The number of connectors 30 connected together depends on the degree of interaction between the two electronic components 3 in the electronic system S. The planar redistribution layer makes it possible to improve the routing between the electronic components 3 as well as the input/output ports of the system S, in particular, in the case of high density of connectors 30.

Figure 1F:
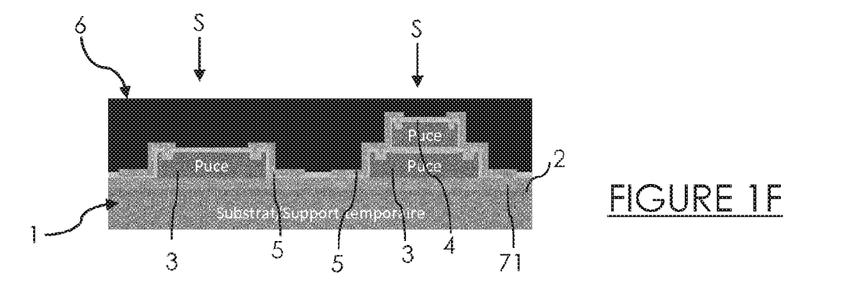

With reference to FIG. 1F, an encapsulation step 6 is represented so as to encapsulate the electronic components 3 and the interconnections 5. In a preferred manner, the encapsulation layer 6 is made of polymer, for example made of epoxy, and filled or not with particles such as silica, alumina, etc., but it goes without saying that other analogous materials could be suitable. In a preferred manner, the encapsulation step is carried out by screen printing, injection moulding, transfer or by compression. Such an encapsulation layer 6 advantageously makes it possible to improve the mechanical robustness and the reliability of the electronic system S.

Figure 1G:
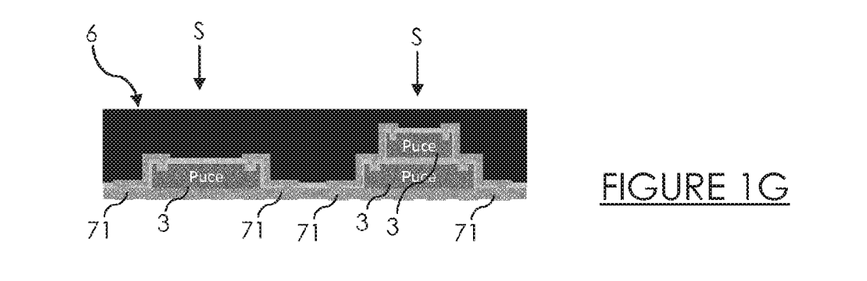

With reference to FIG. 1G, a step of separating the systems S from the sacrificial element 2 is represented. The separation step depends on the nature of the sacrificial element 2. For this purpose, the separation step may be carried out by dissolution or etching, by sliding or by deactivating the sacrificial element 2 by means of a laser, UV or by heating it as in the case of "Revalpha"® from Nitto. In this example, the assembly is heated to a temperature comprised between 120° C. and 250° C. as a function of the sacrificial element 2 used, which does not damage the system S.

Figure 1H:
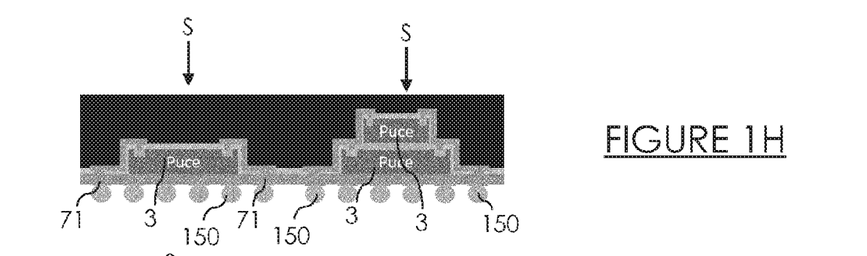

With reference to FIG. 1H, in order to enable a making integral by flipping, the system S comprises conductive balls 150 made integral with the lower connection ports 71 of the system S to connect to a printed circuit. Such conductive balls 150 are known to those skilled in the art under the designation "solder-balls" or "micro-bumps" and will not be described in detail. It goes without saying that the packaging could also be carried out without using conductive balls 150. For example, the system S could be in the form of a package of the QFN or LGA type comprising flat lower connection ports 71.

Figure 1I:
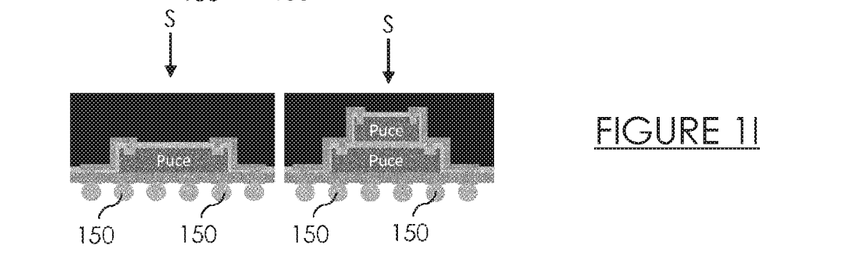

With reference to FIG. 1I, a cutting step so as to separate the electronic systems S in order to be able to use them in an individual manner is represented. Electronic systems S are thus obtained which may be mounted on a circuit printed by different techniques. The mounting may be carried out with tin, alloys or conductive or insulating adhesives.

Several other embodiments of an electronic system S according to the invention are represented with reference to FIGS. 3 to 11. For the sake of clarity and concision, identical or analogous elements between the other embodiments are referenced with the same numerical reference, only differences between the embodiments are described in detail.

Figure 3:
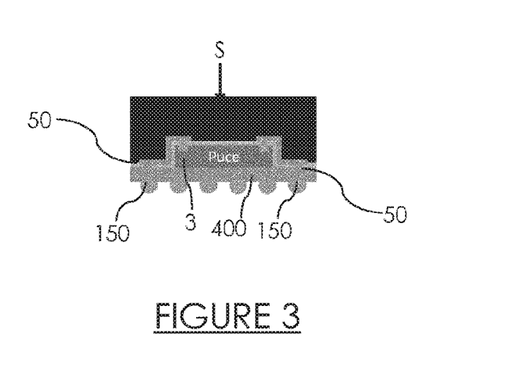
FIG. 3 is a schematic representation of a system with connection balls integrated in a passivation layer.

With reference to FIG. 3, in order to form the input/output pads of the system S, the system S comprises a preliminary passivation layer 400 which is applied on the sacrificial element 2 before the production of the lower redistribution layer 7. After separation of the sacrificial element 2, openings are formed in the lower surface of the system S so as to reach the lower connection ports 71 of the redistribution layer 7. This advantageously enables the mounting of conductive balls 150 in the preliminary passivation layer 400 in contact with the lower connection ports 71. A system S comprising conductive balls 150 but of which the thickness is reduced is thus obtained.

Figure 4:
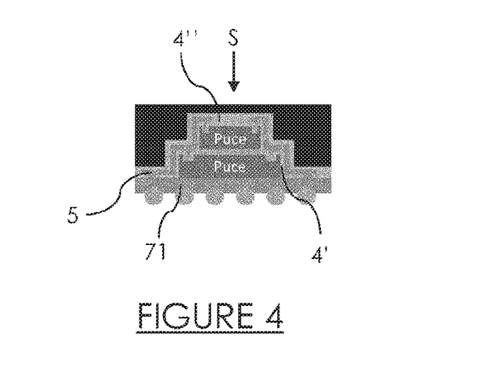
FIG. 4 is a schematic representation of a system with two passivation layers.
Figure 5:
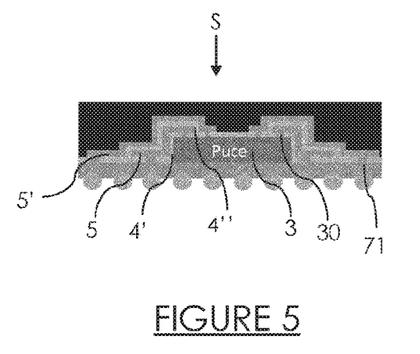
FIG. 5 is a schematic representation of a system with two metal layers of three-dimensional interconnections.

With reference to FIG. 4, as a function of the needs, a third passivation layer 4" may be applied after the production of the interconnections 5 and before the encapsulation step. With reference to FIG. 5, as a function of the complexity, the steps of depositing passivation layers 4', 4" and of depositing the three-dimensional interconnections 5, 5' may be repeated to respond to the need for integration of systems S with high density on interconnects. In other words, superimposed redistribution layers are formed to enable complex connections between a large number of connectors 30 and a large number of lower connection ports 71. This is particularly advantageous for routing a very large number of inputs/outputs, to integrate separately the supply layers or to integrate a shield protecting the circuit from electromagnetic and electrostatic interferences, etc. By repeating the steps of passivation and of production of interconnections 5, it becomes possible to produce a system S comprising several metal layers or a system comprising electronic components 3 of same size which are stacked vertically.

Figure 6:
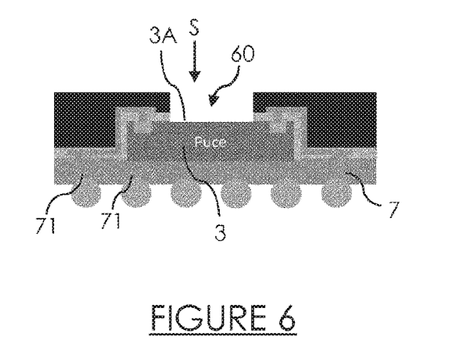
FIG. 6 is a schematic representation of a system with an opening for accessing an electronic component having a sensor function.

With reference to FIG. 6, when one of the electronic components 3 has a sensor function, an opening 60 is produced in the system S in order that the front face 3A of the electronic component 3, having a sensor function, is uncovered. This opening 60 may be created during the encapsulation step, in particular by "transfer moulding" or after encapsulation by locally etching the encapsulation layer or by means of other techniques known to those skilled in the art.

Figure 7:
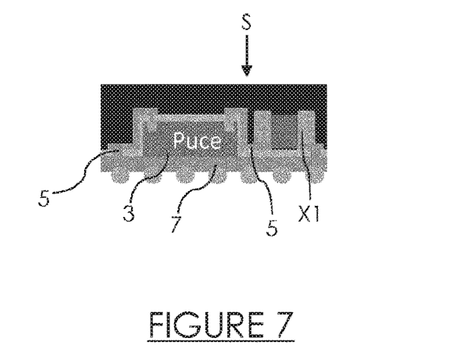
FIGS. 7 and 8 represent a system comprising a surface mounted component.
Figure 8:
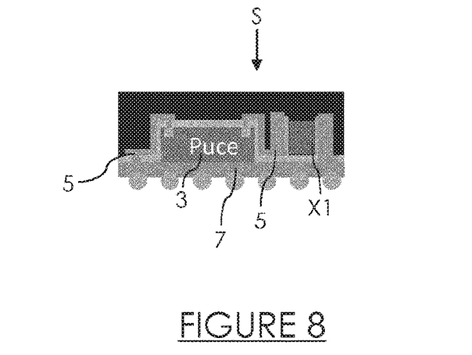

With reference to FIGS. 7 to 8, the electronic system S comprises at least one additional electronic member XI, for example a component of the "Surface Mounted Component" type, which may be positioned in the system S after the production of the three-dimensional interconnections 5 (FIG. 7) or before the production of the three-dimensional interconnections 5 (FIG. 8). The additional electronic member XI is thus arranged beside the stack of electronic components 3. Losses are then reduced. When the additional electronic member XI is made integral before the production of the three-dimensional interconnections 5, it is the three-dimensional interconnections 5 which make it possible to produce the connection, which limits the number of steps of manufacturing the system S.

Figure 9:
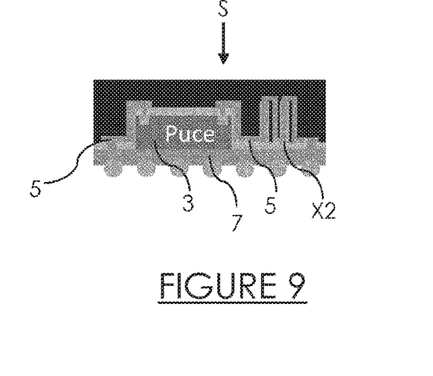
FIG. 9 represents a system comprising a three-dimensional passive component.

With reference to FIG. 9, instead of an additional electronic member XI mounted beside the electronic component(s) 3, the electronic system S comprises one or more passive three-dimensional components X2 which are, preferably, produced simultaneously with the three-dimensional interconnections 5. Losses are then reduced and manufacture is rapid and easy.

According to an aspect of the invention, not represented, the electronic component 3 comprises built-up conductive pads transferred onto the connectors 30 of said electronic component 3. Such built-up pads make it possible to offset vertically the connectors 30 with respect to the front surface 3A of the electronic component 3. In other words, the conductive pads extend vertically projecting from the front surface 3A of the electronic component 3. Such built-up pads make it possible to improve the compatibility with the interconnections 5 or to offset the position of the connectors 30 in order to limit the risk of interference between the three-dimensional interconnections 5 and the electronic component 3. In a preferred manner, the transferred built-up pads are formed prior to the step of producing three-dimensional interconnections. Advantageously, the built-up pads make it possible to make the three-dimensional interconnections 5 compatible with the connectors 30 of the electronic component 3 by forming a compatible metal interface.

Figure 10:
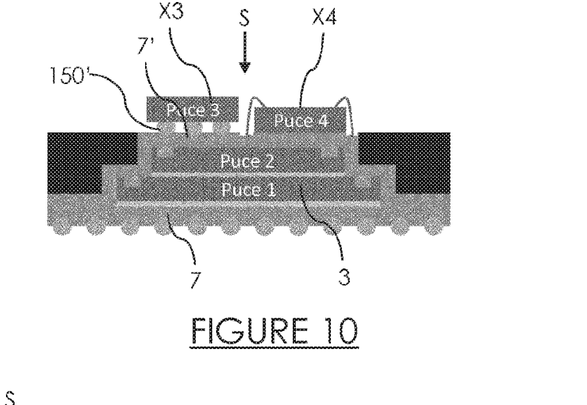
FIGS. 10 and 11 represent several embodiments of systems comprising a redistribution layer placed in the upper part so as to connect to other electronic components.

With reference to FIG. 10, a system is represented comprising an upper redistribution layer 7' created on one or more electronic components 3 of the system S so as to enable the mounting of additional electronic components on the upper face of the system S. In a preferred manner, the upper redistribution layer 7' is planar and produced during the same production step as the plurality of three-dimensional interconnections 5 such as described previously. With reference to FIG. 10, the system S comprises an upper redistribution layer 7' created above electronic components 3 on which are mounted a first electronic component X3 through conductive balls 150' and a second electronic component X4 through wire-bonds. Thus, a mixed vertical integration may be achieved, which offers great design flexibility. It goes without saying that the additional electronic components may be protected by an encapsulation layer, which offers a mechanical and chemical protection of said additional components. This encapsulation may be carried out at the same time as the deposition of the encapsulation layer 6 of the system S or in a separate manner after encapsulation of said system S.

Figure 11:
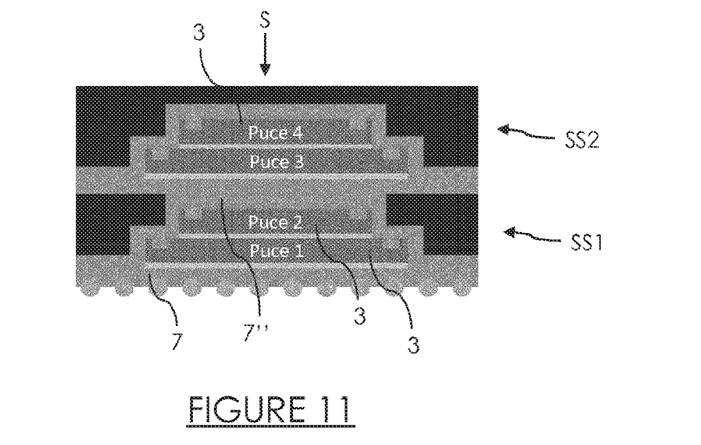

With reference to FIG. 11, a system S may be produced comprising a plurality of sub-systems SS1, SS2 separated by one or more built-up redistribution layers 7". The built-up redistribution layer 7" is created between a lower sub-system SS1 comprising one or more electronic components 3 and an upper sub-system SS2 comprising one or more electronic components 3. Advantageously, the built-up redistribution layer 7" makes it possible to form an electronic system S comprising a stack of sub-systems SS1, SS2 each comprising a stack of electronic components 3 as described previously. Advantageously, the built-up redistribution layer 7" fulfils the function of the lower redistribution layer 7 when it is wished to form an upper sub-system SS2 on a lower sub-system SS1. In other words, the lower sub-system SS 1 is formed as taught previously with reference to FIG. 1 then the built-up redistribution layer 7" is formed and the upper sub-system SS2 is formed using the built-up redistribution layer 7" instead of the lower redistribution layer 7. An electronic system S is thus formed in so called "Build-up". The built-up redistribution layer 7" may be produced in one or more steps. In this example, it is produced in a first step of producing three-dimensional interconnections and a second step of producing a planar redistribution layer. Preferably, the built-up redistribution layer 7" is larger than the surface of the highest electronic component 3 of the lower sub-system SS1 so as to cooperate in an optimal manner with the lowest electronic component of the upper sub-system SS2. The built-up redistribution layer 7" advantageously makes it possible to form the link between the strata. In a preferred manner and according to the need of the system, a passivation layer is deposited below and/or above the built-up redistribution layer 7". Openings are produced in this layer to ensure the electrical connections between the three-dimensional interconnections 5 and the built-up redistribution layer 7".

Figure 12:
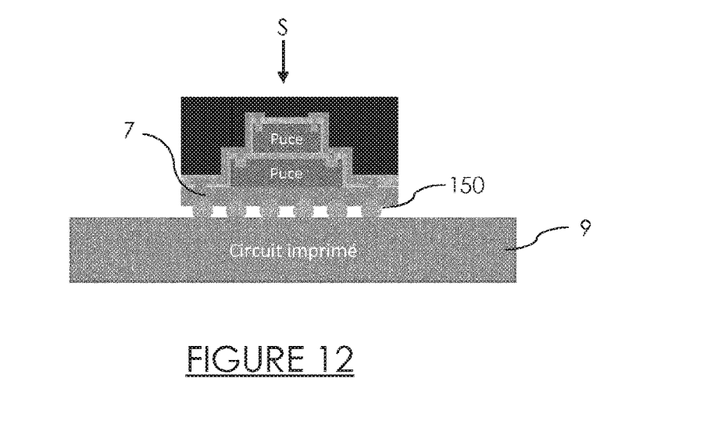
FIG. 12 is a schematic representation of the mounting of a system according to the invention on an integrated circuit.

With reference to FIG. 12, the electronic system S may be connected to a printed circuit 9 by connecting the conductive balls 150 on the tracks of the printed circuit 9. The presence of a lower redistribution layer 7 advantageously makes it possible to offer great freedom for the positioning of the conductive balls 150 in order to adapt to all the constraints of the printed circuit 9.

Thanks to the invention, electronic systems S enabling a heterogeneous and three-dimensional integration may be produced. This type of integration enables considerable miniaturisation and an improvement in the performances of the systems S without using complex technologies such as that of through vias.

Advantageously, the manufacturing method only necessitates a small number 10 of technological steps making it possible to produce several electronic systems S simultaneously, which reduces the manufacture time and cost.

This method enables great design flexibility. Furthermore, the topology may be optimised to improve the electrical and thermal performances and to respond to the needs of applications having a large number of inputs/outputs and/or integrating sensors. The three-dimensional integration, by use of a same metallisation layer or by integrating several metal layers, makes it possible to obtain optimal miniaturisation without degrading the functions.

The different exemplary embodiments have been described for electronic components being in the form of electronic chips. Nevertheless, it is recalled that other types of electronic components could be suitable.

The invention claimed is:

1. A method for manufacturing an electronic system comprising:
   a step of applying a sacrificial element on a carrier,
   a step of producing a lower redistribution layer defining a plurality of lower connection ports connected to a plurality of inner connection ports forming connection ports of the system, the lower redistribution layer being formed by a plurality of interconnections produced by metal deposition,
   a step of transferring at least one electronic component onto the lower redistribution layer, the at least one electronic component comprising a front surface comprising a plurality of connectors and a rear surface opposite to the front surface, the rear surface of the at least one electronic component being positioned facing the lower redistribution layer on a side of the inner connection ports, a step of depositing a passivation layer so as to cover a surface of the lower redistribution layer and the at least one electronic component while maintaining the plurality of connectors of the at least one electronic component and the inner connection ports uncovered, a step of producing a plurality of three-dimensional interconnections produced by metal deposition so as to connect the plurality of connectors of the at least one electronic component to the inner connection ports of the lower redistribution layer, the plurality of three-dimensional interconnections being produced by metal deposition in openings formed in a photosensitive resin layer, said openings defining shapes of the three-dimensional interconnections, an encapsulation step, and a step of separating the system from the sacrificial element.

2. The method according to claim 1, wherein the sacrificial element is an adhesive film.

3. The method according to claim 1, wherein the sacrificial element is configured to lose its adherence characteristics from a predetermined temperature.

4. The method according to claim 1, wherein the sacrificial element is configured to lose its adherence characteristics following an illumination.

5. The method according to claim 1, wherein lower connection ports extend under the at least one electronic component.

6. The method according to claim 1, further comprising a step of producing an opening in the system so as to uncover a front face of at least one electronic component having a sensor function.

7. The method according to claim 1, further comprising a step of forming a three-dimensional passive component on the at least one electronic component during the step of producing a plurality of three-dimensional interconnections.

8. The method according to claim 1, comprising a step of transferring at least two superimposed electronic components onto the lower redistribution layer and a step of connecting connectors of said at least two superimposed electronic components during the step of producing the plurality of three-dimensional interconnections.

9. The method according to claim 1, wherein the passivation layer is deposited conformally.

10. The method according to claim 1, further comprising a step of producing an upper redistribution layer connected to the plurality of connectors of said at least one electronic component.

11. The method according to claim 10, further comprising a step of depositing at least one electronic component on the upper redistribution layer, the at least electronic component on the upper redistribution layer comprising a front surface comprising a plurality of connectors and a rear surface opposite to the front surface, the rear surface of the at least one electronic component on the upper redistribution layer being positioned facing the upper redistribution layer.

12. The method according to claim 1, wherein at least one connector and at least one inner connection port of the lower redistribution layer are spaced apart by a vertical distance greater than 10 µm and three-dimensionally interconnected.

13. The method according to claim 12, wherein at least one interconnection, connecting at least one connector and at least one inner connection port, has an aspect ratio greater than 2.5:1 for a vertical distance comprised between 10 µm and 100 µm.

14. A method for manufacturing an electronic system comprising:

a step of applying a sacrificial element on a carrier, a step of producing a lower redistribution layer defining a plurality of lower connection ports connected to a plurality of inner connection ports forming connection ports of the system, the lower redistribution layer being formed by a plurality of interconnections produced by metal deposition, a step of transferring at least one electronic component onto the lower redistribution layer, the at least one electronic component comprising a front surface comprising a plurality of connectors and a rear surface opposite to the front surface, the rear surface of the at least one electronic component being positioned facing the lower redistribution layer on a side of the inner connection ports, a step of producing a plurality of three-dimensional interconnections produced by metal deposition so as to connect the plurality of connectors of the at least one electronic component to the inner connection ports of the lower redistribution layer, the plurality of three-dimensional interconnections being produced by metal deposition in openings formed in a photosensitive resin layer, said openings defining shapes of the three-dimensional interconnections, a step of producing an opening in the system so as to uncover a front face of at least one electronic component having a sensor function, an encapsulation step, and a step of separating the system from the sacrificial element.

15. A method for manufacturing an electronic system comprising:

a step of applying a sacrificial element on a carrier, a step of producing a lower redistribution layer defining a plurality of lower connection ports connected to a plurality of inner connection ports forming connection ports of the system, the lower redistribution layer being formed by a plurality of interconnections produced by metal deposition, a step of transferring at least one electronic component onto the lower redistribution layer, the at least one electronic component comprising a front surface comprising a plurality of connectors and a rear surface opposite to the front surface, the rear surface of the at least one electronic component being positioned facing the lower redistribution layer on a side of the inner connection ports, a step of producing a plurality of three-dimensional interconnections produced by metal deposition so as to connect the plurality of connectors of the at least one electronic component to the inner connection ports of the lower redistribution layer, the plurality of three-dimensional interconnections being produced by metal deposition in openings formed in a photosensitive resin layer, said openings defining shapes of the three-dimensional interconnections, a step of transferring at least two superimposed electronic components onto the lower redistribution layer and a step of connecting connectors of said at least two superimposed electronic components during the step of producing the plurality of three-dimensional interconnections, an encapsulation step, and a step of separating the system from the sacrificial element.

* * * * *